(12) United States Patent
Mohammadpour et al.

(10) Patent No.: US 10,199,977 B1
(45) Date of Patent: Feb. 5, 2019

(54) ELECTRICAL SYSTEMS HAVING INTERLEAVED DC INTERCONNECTS

(71) Applicant: HONEYWELL INTERNATIONAL INC., Morris Plains, NJ (US)

(72) Inventors: Ali Mohammadpour, Torrance, CA (US); Andrew Love, Marina Del Ray, CA (US); Louis Pu, Torrance, CA (US); Mike Guidry, Redondo Beach, CA (US)

(73) Assignee: Garrett Transportation I Inc., Torrance, CA (US)

( * ) Notice: Subject to any disclaimer, the term of this patent is extended or adjusted under 35 U.S.C. 154(b) by 0 days.

(21) Appl. No.: 15/783,695

(22) Filed: Oct. 13, 2017

(51) Int. Cl.
| | | |
|---|---|---|
| H02P 27/04 | (2016.01) |
| H02P 27/06 | (2006.01) |
| H05K 1/18 | (2006.01) |
| H05K 1/11 | (2006.01) |
| H05K 1/14 | (2006.01) |

(52) U.S. Cl.
CPC .............. *H02P 27/06* (2013.01); *H05K 1/111* (2013.01); *H05K 1/144* (2013.01); *H05K 1/181* (2013.01); *H05K 2201/042* (2013.01); *H05K 2201/10015* (2013.01); *H05K 2201/10166* (2013.01); *H05K 2201/10272* (2013.01); *H05K 2201/10522* (2013.01)

(58) Field of Classification Search
CPC ..... H01L 22/22; H01L 31/153; H01L 31/173; H02M 7/537; H02M 3/335; H02M 3/325; H02M 3/3155; H02M 7/003; H02M 1/10; H02M 1/20; H02M 7/54; H02M 7/515; H02M 7/487; H03B 19/14; H02K 47/04; H02P 27/04; H02P 27/06
USPC .......... 318/800, 801, 400.01, 700, 701, 727, 318/722; 363/16, 27, 37, 40, 55, 56.01, 363/57, 95, 109, 120, 131, 135, 159, 176; 438/6, 25, 381; 257/27, 47, 68, 124, 213, 257/565, E27.01, E27.027, E29.343, 257/E25.01, E25.023, E23.001, E23.178
See application file for complete search history.

(56) References Cited

U.S. PATENT DOCUMENTS

| | | | |
|---|---|---|---|
| 7,482,648 B2 | 1/2009 | Xianyu et al. | |
| 7,907,385 B2 | 3/2011 | Korich et al. | |
| 8,169,780 B2* | 5/2012 | Yoshino | H05K 7/20927 165/104.33 |
| 8,279,620 B2* | 10/2012 | Herron | H02M 7/003 361/784 |
| 8,787,003 B2 | 7/2014 | Domes et al. | |

(Continued)

*Primary Examiner* — Antony M Paul
(74) *Attorney, Agent, or Firm* — Lorenz & Kopf, LLP (57) ABSTRACT

Electrical systems and devices with substrate interconnections having reduced parasitic inductance are provided. A first substrate includes one or more capacitors and plurality of connection interfaces, wherein a first subset of connection interfaces electrically connected to a first reference voltage are interleaved with a second subset of connection interfaces electrically connected to a different reference voltage. A second substrate includes a third subset of connection interfaces are electrically connected to a first terminal of a first switching element and the first subset of connection interfaces and a fourth subset of connection interfaces electrically connected to a second terminal of a second switching element and the second subset of connection interfaces, and the third subset and the fourth subset are also interleaved.

20 Claims, 6 Drawing Sheets

(56) References Cited

U.S. PATENT DOCUMENTS

| | | |
|---|---|---|
| 2006/0290689 A1 | 12/2006 | Grant et al. |
| 2007/0156938 A1 | 7/2007 | Wu et al. |
| 2007/0296057 A1 | 12/2007 | Apel |
| 2010/0181101 A1 | 7/2010 | Han et al. |
| 2010/0328893 A1* | 12/2010 | Higashidani ....... H05K 7/20927 361/702 |
| 2017/0197730 A1* | 7/2017 | Lutze .................. H02M 5/458 |

* cited by examiner

ELECTRICAL SYSTEMS HAVING INTERLEAVED DC INTERCONNECTS

TECHNICAL FIELD

The subject matter described herein relates generally to electrical systems, and more particularly, relates to reducing inductance associated with direct current (DC) interconnections with switching circuitry to reduce voltage ringing or other transient effects.

BACKGROUND

Turbocharger systems are frequently used to improve the efficiency of internal combustion engines. In some systems, an electric motor, motor-generator, or other actuator is coupled to the rotational shaft of the turbocharger to broaden the manner in which the turbocharger can be operated. For alternating current (AC) electric motors, the torque or speed of the motor is related to the current provided to the motor. In many applications, input motor current is not directly controlled. For example, pulse-width modulation (PWM) techniques are commonly utilized in combination with an inverter (or another switched-mode power supply) to control the direct current (DC) voltage applied across motor windings in a manner that produces a desired AC current in the motor.

In practice, electrical parasitic elements within electrical circuits are unavoidable due to physical non-idealities. These electrical parasitics can have potentially damaging side effects at higher switching frequencies. For example, when a switching device is switched off and current is prevented from flowing through a parasitic inductance, a corresponding voltage is created within the circuit. This, in turn, may result in voltage ringing or ripple within the DC portion of the electrical system, which can be potentially damaging or compromise operations. While snubber circuits or other components can be added to mitigate the impact of voltage transients or oscillations, these components can increase costs while also potentially complicating circuit layout, packaging, and the like. Other approaches involve modifying switching operations (e.g., soft turn offs, etc.), which can compromise performance or efficiency. Accordingly, it is desirable to minimize parasitic elements within the DC portion of the electrical system without adding components or modifying switching operation.

BRIEF SUMMARY

Electrical systems having reduced inductance interconnects between substrates or circuit boards are provided. One exemplary electrical system includes a first substrate comprising one or more capacitors on a first side and a first plurality of connection interfaces on a second side opposite the first side and a second substrate comprising a second plurality of connection interfaces. A first subset of the first plurality of connection interfaces is electrically connected to a first reference voltage node, a second subset of the first plurality of connection interfaces is electrically connected to a second reference voltage node different from the first reference voltage node, and the first subset and the second subset are interleaved with one another. A third subset of the second plurality of connection interfaces is electrically connected to a first terminal of a first switching element and coupled to the first subset of the first plurality of connection interfaces, a fourth subset of the second plurality of connection interfaces is electrically connected to a second terminal of a second switching element and coupled to the second subset of the first plurality of connection interfaces, and the third subset and the fourth subset are interleaved with one another.

In another embodiment, a first substrate includes a pair of voltage rails configured to provide a voltage bus, one or more capacitive elements coupled between the pair of voltage rails to provide a direct current (DC) link capacitance, a first plurality of connection interfaces electrically connected to a first voltage rail of the pair, and a second plurality of connection interfaces electrically connected to a second voltage rail of the pair, wherein the second plurality of connection interfaces are interleaved with the first plurality of connection interfaces. A second substrate includes a third plurality of connection interfaces electrically connected to the first plurality of connection interfaces, a fourth plurality of connection interfaces electrically connected to the second plurality of connection interfaces, wherein the fourth plurality of connection interfaces are interleaved with the third plurality of connection interfaces, and a power conversion arrangement coupled to the third plurality of connection interfaces and the fourth plurality of connection interfaces.

In yet another embodiment, an electrical system includes a first substrate comprising one or more capacitors on a first side of the first substrate and a first plurality of connection interfaces on a second side of the first substrate opposite the first side and a second substrate comprising a second plurality of connection interfaces. A first electrode of the one or more capacitors is coupled to a first bus bar on the first side of the first substrate, a second electrode of the one or more capacitors is coupled to a second bus bar on the second side of the first substrate, a first subset of the first plurality of connection interfaces is electrically connected to the first bus bar, a second subset of the first plurality of connection interfaces is electrically connected to the second bus bar, and connection interfaces of the first subset are alternately interposed with connection interfaces of the second subset. A third subset of the second plurality of connection interfaces is coupled to the first subset of the second plurality of connection interfaces, a fourth subset of the second plurality of connection interfaces is coupled to the second subset of the second plurality of connection interfaces, a first switching element is coupled between the third subset of the second plurality of connection interfaces and an output node, a second switching element is coupled between the output node and the fourth subset, and connection interfaces of the third subset are alternately interposed with connection interfaces of the fourth subset.

BRIEF DESCRIPTION OF THE DRAWINGS

Embodiments of the subject matter will hereinafter be described in conjunction with the following drawing figures, wherein like numerals denote like elements, and.

DETAILED DESCRIPTION

Embodiments of the subject matter described herein relate to interleaved electrical interconnections between distinct electrical circuits to reduce parasitic inductance between the electrical circuits, and thereby, reduce voltage ringing and other transient effects or oscillations. For purposes of explanation, but without limitation, the subject matter is primarily described herein in the context of interleaving interconnections between electronics substrates or circuit boards; however, it should be appreciated that the subject matter is not necessarily limited to use with electronics substrates or circuit boards and could be utilized in an equivalent manner for other physically or logically distinct electrical components, circuits, or systems.

In exemplary embodiments described herein, one of the substrates includes one or more capacitors and a voltage bus corresponding to a direct current (DC) voltage differential, with the capacitor(s) being configured electrically in parallel with the voltage bus to provide a so-called "DC-link" capacitance that helps to support a substantially constant and stable voltage differential across the bus. For purposes of explanation, the electronics substrate or circuit board having the having the DC link capacitor and DC voltage bus may be alternatively referred to herein as the DC link substrate.

The DC link substrate includes multiple connection interfaces (e.g., pins, pads, terminals, or the like), which are grouped into distinct subsets of connection interfaces. Connection interfaces of a first subset of the connection interfaces are coupled to a first reference voltage node of the voltage bus (e.g., the positive voltage rail or bus bar) on the substrate, with connection interfaces of a second subset of the connection interfaces being coupled a different reference voltage node of the voltage bus (e.g., the negative voltage rail or bus bar). Connection interfaces of the first subset are interleaved with neighboring connection interfaces of the second subset, such that a connection interface of the second subset is alternately interposed between otherwise neighboring connection interfaces of the first subset, and vice versa. Similarly, the electronics substrate to be connected to the DC link substrate also includes multiple connection interfaces, with connection interfaces to be coupled to the positive bus voltage on the DC link substrate being interleaved with connection interfaces to be coupled to the negative bus voltage on the DC link substrate. When the interleaved connection interfaces on the DC link substrate are coupled to the corresponding interleaved connection interfaces on the other electronics substrate, the interleaved connections reduce the current loop area, and thereby, reduces parasitic inductance associated with the DC link substrate interconnect. Dividing the interconnection points for the load current between substrates into multiple parallel current paths also reduces the effective parasitic inductance associated with the interconnection (e.g., because inductances in parallel reduce the effective series inductance).

In exemplary embodiments, the electronics substrate interfacing with the DC link substrate includes an inverter or other power conversion arrangement that having switching elements that are modulated to regulate the voltage, and thereby the input current provided to an electrical load, such as an electric motor. Accordingly, for purposes of explanation, the electronics substrate coupled to the DC link substrate may alternatively be referred to herein as the power converter substrate. In one or more embodiments, the switching elements are realized as surface mount devices (SMDs) soldered, mounted, or otherwise affixed to a surface on one side of the power converter substrate using surface mount technology. The side of the power converter substrate having the switching elements may also include the connection interfaces for coupling to the DC link substrate, so that the other side of the power converter substrate may be exposed to coolant or otherwise cooled.

In exemplary embodiments, the DC link substrate includes the connection interfaces for coupling to the power converter substrate on the side of the DC link substrate that faces the power converter substrate, with the DC link capacitor(s) being provided on the opposing side of the DC link substrate. This results in improved thermal isolation between the switching elements and the DC link capacitor(s), which, in turn, may allow for thermal design constraints as well as other constraints on the size or form factor of the capacitor(s) to be relaxed or otherwise determined independently of the power converter electronics. In this regard, one or more exemplary embodiments employ electrolytic aluminum capacitors mounted on the side of the DC link substrate opposite the power converter substrate. Additionally, by virtue of the reduced parasitic series inductance between the power converter substrate and the DC link capacitance achieved by the interleaved DC link interconnect, the impact of the internal parasitic inductance of the capacitors may also be mitigated.

Figure 1:
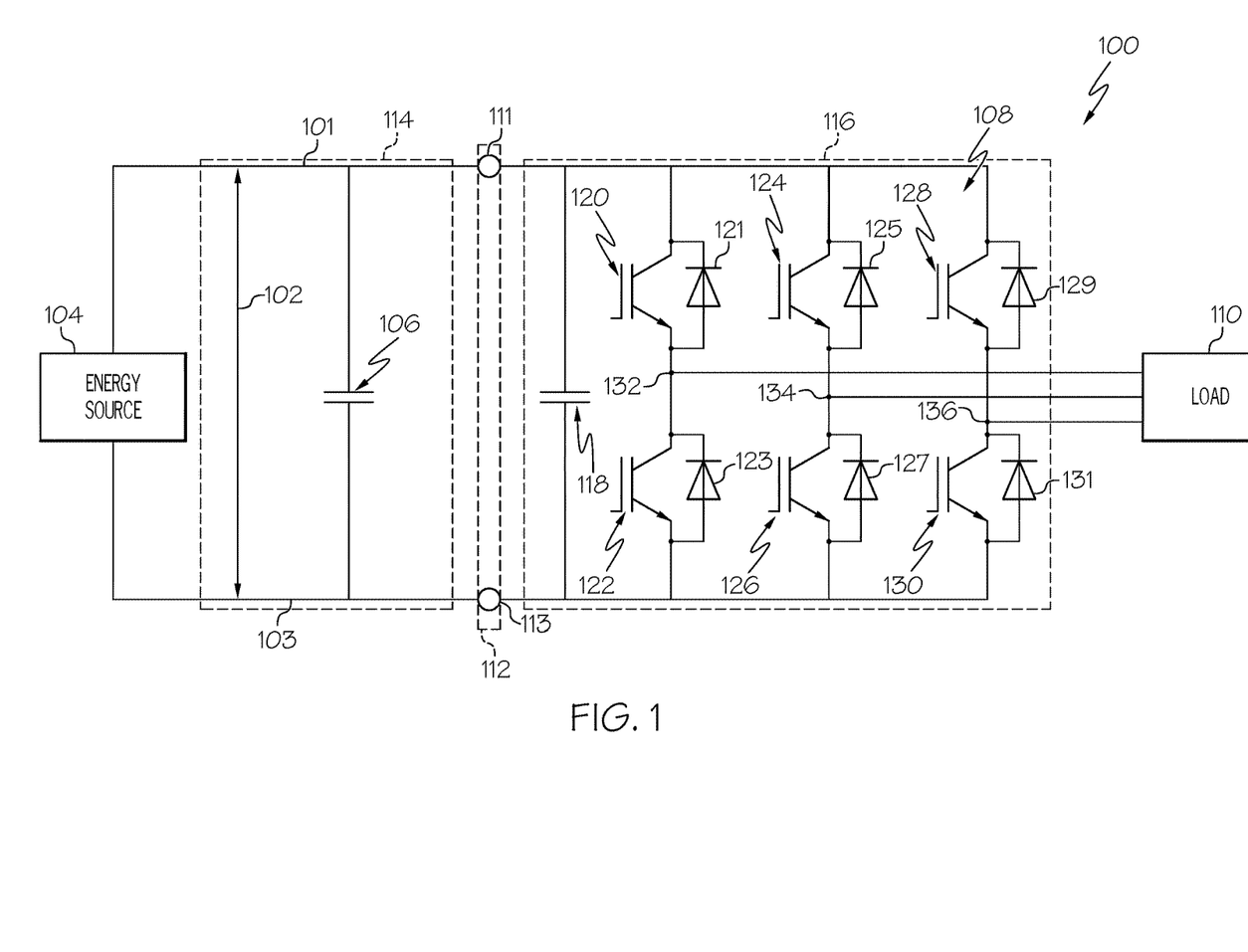
FIG. 1 depicts a schematic diagram of an electrical system in an exemplary embodiment.

FIG. 1 depicts an electrical circuit schematic view of exemplary embodiment of an electrical system 100 that includes, without limitation, a voltage bus 102 including a pair of voltage rails 101, 103 configured to be coupled to corresponding terminals of a DC energy source 104 to provide a DC voltage bus, a capacitive element 106 coupled to the voltage bus 102, and a power conversion arrangement 108 coupled to an electrical load 110. The power conversion arrangement 108 is coupled to the DC voltage bus 102 at a DC interface (or interconnect) 112. In this regard, the DC interface 112 generally represents the physical interfaces (e.g., terminals, connectors, and the like) for coupling the power conversion arrangement 108 to the voltage bus 102, and thereby, the DC energy source 104. In exemplary embodiments, the voltage rails 101, 103 and capacitive element 106 are provided on a first substrate 114, alternatively referred to herein as the DC link substrate, and the power conversion arrangement 108 is provided on a separate substrate 116, alternatively referred to as the power conversion substrate, with the DC interface 112 representing the connections interfaces between the substrates 114, 116, as described in greater detail below.

Depending on the embodiment, the DC energy source 104 may be realized as any sort of battery, fuel cell (or fuel cell stack), rectified generator output, or other suitable DC voltage source. The voltage rails 101, 103 of the voltage bus 102 generally represent conductive elements that route a component of the DC energy source voltage to other components of the electrical system 100. In this regard, a first voltage rail 101 corresponds to a positive reference (or supply) voltage for the electrical system 100 and the second voltage rail 103 corresponds to a negative reference (or ground) voltage for the electrical system 100, with the difference between the voltage of the first voltage rail 101 and the second voltage rail 103 corresponding to the bus voltage or DC link voltage. In one or more exemplary embodiments, the voltage bus 102 is realized as a 48 Volts DC automotive bus, that is, the potential difference between the first voltage rail 101 and the second voltage rail 103 is substantially equal to 48 Volts DC. For convenience, but without limitation, the first voltage rail 101 may be referred to herein as the positive voltage rail or supply voltage rail and the second voltage rail 103 may be referred to herein as the negative voltage rail or ground voltage rail. In one or more exemplary embodiments, the voltage rails 101, 103 are realized as bus bars, and more particularly, laminated bus bars provided on or within the DC link substrate 114.

In an exemplary embodiment, the capacitive element 106 is realized as one or more capacitors coupled between the voltage rails 101, 103 of the voltage bus 102 to provide a desired capacitance configured electrically parallel to the electrical load that may be coupled to the voltage bus 102 at the interconnect 112, whereby the capacitance of the capacitive element 106 helps to maintain a stable DC bus voltage differential between rails 101, 103 and mitigates or otherwise absorbs voltage transients. In one or more exemplary embodiments, the capacitive element 106 is realized using one or more electrolytic aluminum capacitors. For purposes of explanation, the capacitive element 106 is alternatively referred to herein as the DC link capacitor 106.

In the illustrated embodiment, the electrical load 110 is realized as a multi-phase alternating current (AC) load, such as a 3-phase electric motor, with the power conversion arrangement 108 being realized as a DC-to-AC power inverter having the corresponding number of phase legs. For example, for a 3-phase electrical load 110, the illustrated power inverter 10 includes six switching elements (or switches) 120, 122, 124, 126, 128, 130 with antiparallel diodes 121, 123, 125, 127, 129, 131 (i.e., diodes which are antiparallel to each of the switching elements) provided on the substrate 116. In this regard, pairs of switches and diodes are configured electrically in parallel with reversed or inverse polarity. The antiparallel configuration allows for bidirectional current flow while blocking voltage unidirectionally. In this configuration, the direction of current through the switches is opposite to the direction of allowable current through the respectively paired diodes. The antiparallel diodes are connected across each switch to provide a path for current to the DC energy source 104 when the respective switch is off (e.g., for charging the DC energy source 104). In exemplary embodiments, the switches are realized using field-effect transistors (e.g., a MOSFET); however, in alternative embodiments, the switches may be realized as insulated-gate bipolar transistors (IGBTs) or another switching device.

As shown, the switches 120, 122, 124, 126, 128, 130 of the inverter 108 are arranged into three phase legs (or pairs), with each phase leg being coupled to a respective phase of the electrical load 110 (e.g., a set or phase of stator windings). In this regard, a node 132 between the switches 120, 122 of the first phase leg is coupled to a first phase of the load 110, a second node 134 between switches 124, 126 is coupled to a second phase of the load 110, and a third node 136 between switches 128, 130 is coupled to a third phase of the load 110. In this regard, when switch 120 is closed or otherwise turned on, a current is allowed to flow from a positive reference node 111 of the DC link interface 112 to the load 110 at node 132, and conversely, when switch 122 is closed or otherwise turned on, a current is allowed to flow from the load 110 at node 132 to a negative reference node 113 of the DC link interface 112.

The positive reference node 111 corresponds to the physical interface between the subset of interleaved connection interfaces of the DC link substrate 114 that are coupled to the positive voltage rail 101 and/or the positive terminal of the DC link capacitor 106 and the corresponding subset of interleaved connection interfaces of the power converter substrate 116 that are coupled to the drain terminals of the upper phase leg MOSFET switches 120, 124, 128. Similarly, the negative reference node 113 corresponds to the physical interface between the subset of interleaved connection interfaces of the DC link substrate 114 that are coupled to the negative voltage rail 103 and/or the negative terminal of the DC link capacitor 106 and the corresponding subset of interleaved connection interfaces of the power converter substrate 116 that are coupled to the source terminals of the lower phase leg MOSFET switches 122, 126, 130.

Although not illustrated in FIG. 1, in exemplary embodiments, a control module is coupled to the gate terminals of the MOSFET switches 120, 122, 124, 126, 128, 130 (e.g., via gate driver circuitry) and configured to modulate the switches 120, 122, 124, 126, 128, 130 and thereby control the inverter 108 using high frequency pulse width modulation (PWM). In this regard, the control module generates or otherwise provides PWM command signals to operate (e.g., open and/or close) the switches 120, 122, 124, 126, 128, 130 of the inverter phase legs to cause output voltages to be applied across the load 110, which, in turn, produces current(s) through the load 110 (e.g., the different phase windings of the motor) to operate the load 110 in a desired manner. Accordingly, by employing interleaved connection interfaces at the nodes 111, 113 of the DC link interface 112 that reduce the current loop area associated with the load current flowing between nodes 111, 113 through the inverter 108, the parasitic inductance associated with the DC link interface 112 is reduced, which, in turn, reduces ringing on the voltage bus 102 when high frequency PWM commands are utilized to operate the switches 120, 122, 124, 126, 128, 130. Additionally, one or more snubber capacitors 118 may be provided on the power converter substrate 116 and coupled between the interleaved connection interfaces of the power converter substrate 116 to achieve a parallel configuration with respect to the inverter 108 to further support maintaining a stable DC voltage differential between the nodes of the DC link interface 112 and help mitigate or otherwise absorb voltage transients.

It should be understood that FIG. 1 is a simplified representation of an electrical system 100 for purposes of explanation and is not intended to limit the scope or applicability of the subject matter described herein in any way. Thus, although FIG. 1 depicts direct electrical connections between circuit elements and/or terminals, alternative embodiments may employ intervening circuit elements and/or components while functioning in a substantially similar manner.

Figure 2:
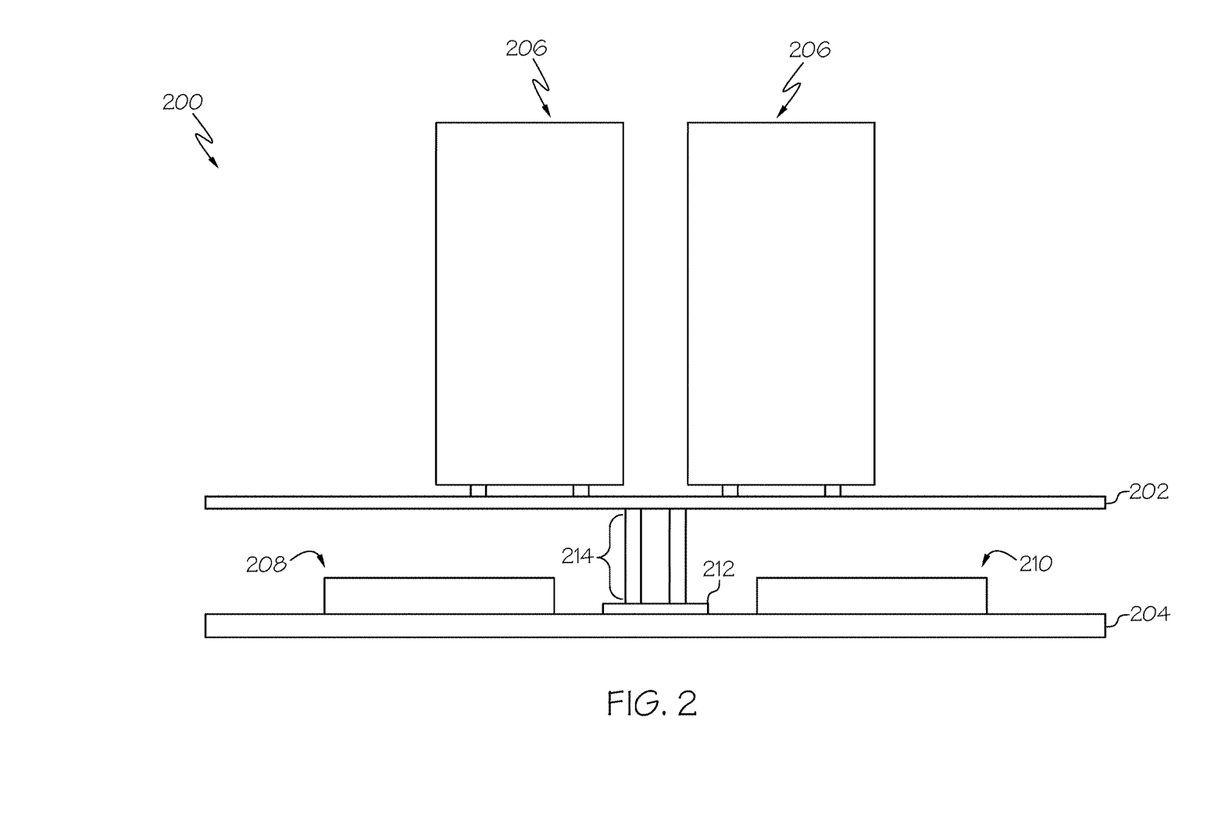
FIG. 2 depicts a plan view of an electrical system including a direct current (DC) link substrate and a power converter substrate suitable for use with the electrical system of FIG. 1 in accordance with one or more exemplary embodiments.

FIG. 2 depicts a plan view of an exemplary embodiment of an electrical system 200 including a DC link substrate 202 coupled to a power converter substrate 204 suitable for use as the DC link substrate 114 and the power converter substrate 116 in the electrical system 100 of FIG. 1.

The illustrated DC link substrate 202 includes a plurality of capacitors 206 mounted, soldered, or otherwise affixed to a first side of the DC link substrate 202 that faces away from the power converter substrate 116. A positive terminal of the capacitors 206 is electrically connected to a positive voltage rail of a DC voltage bus (e.g., voltage rail 101) and a negative terminal of the capacitors 206 is electrically connected to a negative voltage rail of the DC voltage bus (e.g., voltage rail 103) such that the capacitors 206 are configured as a DC link capacitance (e.g., DC link capacitor 106) electrically parallel to an interface between the substrates 202, 204. For example, in one embodiment, the DC link substrate 202 is realized as a multilayer substrate that includes a first layer configured to provide a first bus bar electrically connected to the positive terminal of a DC energy source and a second bus bar electrically connected to the negative terminal of the DC energy source. That said, in other embodiments, a DC voltage bus could be realized on the DC link substrate 202 using conductive traces, wires, or other configurations of conductive elements.

The power converter substrate 204 includes switching elements 208, 210 configured to be coupled between the DC voltage bus of the DC link substrate 202 and an electrical load (e.g., load 110). In the illustrated embodiment, the switching elements 208, 210 are realized as surface mount transistor devices mounted, soldered, or otherwise affixed to a surface of the power converter substrate 204 that faces the DC link substrate 202.

In the illustrated embodiment of FIG. 2, the power converter substrate 204 also includes a connection structure 212 provided thereon that is configured to provide a plurality of connection interfaces for establishing electrical connections to the power converter substrate 204 and components thereon. The connection structure 212 mates, joins, or otherwise physically interfaces with a corresponding connection structure 214 associated with the DC link substrate 202, thereby establishing electrical interconnections between the DC voltage bus provided on the DC link substrate 202 and the components of the power converter substrate 204. In the illustrated embodiment, the connection structure 212 on the power converter substrate 204 is realized as a surface mount device pin header comprising a plurality of pins, pads, receptacles, sockets, or the like that are configured to mate or engage with, or otherwise receive, corresponding connection interfaces associated with the DC link connection structure 214. For example, the DC link connection structure 214 could be similarly realized as a pin header provided on a surface of the DC link substrate 202 that faces the power converter substrate 204 and comprises a plurality of protruding pins, with the power converter connection structure 212 comprising a plurality of receptacles, sockets, or the like that receive the pins of the DC link connection structure 214. In one or more exemplary embodiments, the dimensions of the connection structures 212, 214 are configured to minimize the distance or length of the current path between the substrates 202, 204 to thereby minimize parasitic inductance of the interconnect. It should be appreciated that the subject matter described herein is not limited to any particular type or combination of electrical connectors used to provide a physical electrical interface between the substrates 202, 204.

In exemplary embodiments, the connection interfaces of the connection structures 212, 214 are logically partitioned according to their electrical potential or configuration and then physically interleaved with one another. In this regard, FIG. 3 depicts a top view of an exemplary layout of a portion of a power converter substrate 300 having interleaved connection interfaces 310, 312 for coupling switching elements 302, 304 of a power converter to a DC voltage bus.

Figure 3:
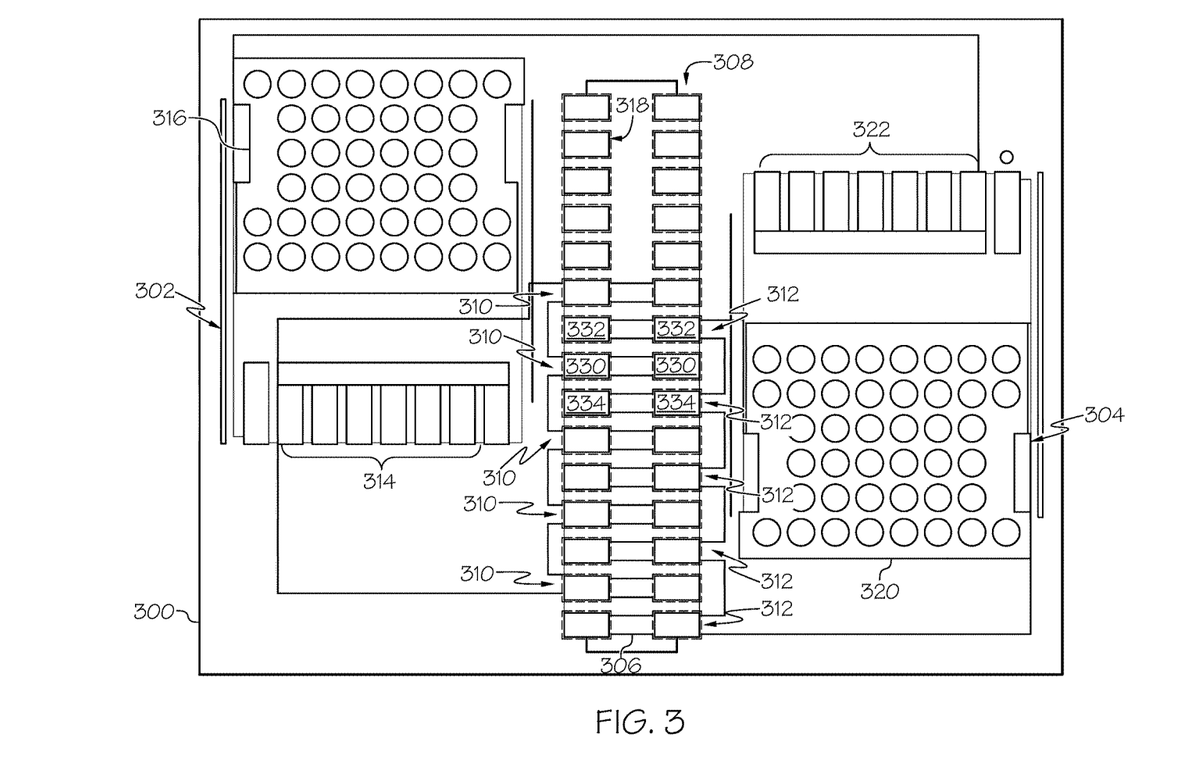
FIG. 3 depicts a top view of a layout of a portion of a power converter substrate suitable for use in the electrical system of FIG. 2 in accordance with one or more exemplary embodiments.

Referring now to FIG. 3, with reference to FIGS. 1-2, the power converter substrate 300 includes a connection structure 306 (e.g., connection structure 212) that includes a plurality of pins, pads, terminals, or other suitable electrical connection interfaces 308 that are grouped or otherwise divided into subsets 310, 312 that are interleaved with one another and electrically connected to corresponding interleaved connection interfaces on a DC link substrate 114, 202. In this regard, a first subset 310 of the connection interfaces 308 mates, engages, receives, or otherwise connects to a corresponding subset of connection interfaces of a DC link substrate 114, 202 coupled to a positive voltage rail 101 to provide a positive reference node 111 of the DC link connection interface 112. The connection interfaces of the positive DC bus subset 310 are electrically connected to drain terminal interfaces 314 of a switching element 120, 208, 302 via routing on the power converter substrate 116, 204, 300. A source terminal interface 316 of the switching element 120, 208, 302 is similarly electrically connected to another subset 318 of the power converter connection interfaces 308 via routing on the power converter substrate 116, 204, 300 to provide an output node 132 of the power converter, which, in turn, is electrically connected to the load 110. In this regard, the source terminal interface 316 may be realized using a conductive structure on the bottom of the switching element 120, 208, 302 (e.g., the lead frame or pad of a SMD FET) that is soldered or otherwise mounted to metal routing on the surface of the power converter substrate 116, 204, 300 that electrically connects to the load connection interfaces 318.

A second subset 312 of the connection interfaces 308 mates, engages, receives, or otherwise connects to a corresponding subset of connection interfaces of the DC link substrate 114, 202 coupled to a negative voltage rail 103 to provide a negative reference node 113 of the DC link connection interface 112. The connection interfaces of the negative DC bus subset 312 are electrically connected to a source terminal interface 320 of a switching element 122, 210, 304 via routing on the power converter substrate 116, 204, 300. Again, the source terminal interface 320 may be realized as a conductive structure on the bottom of the switching element 122, 210, 304 that is soldered or otherwise mounted to metal routing on the surface of the power converter substrate 116, 204, 300 that electrically connects to the negative DC bus connection interfaces 312. The drain terminal interfaces 322 of the switching element 122, 210, 304 are electrically connected to the source terminal 316 of the switching element 120, 208, 302 at the node 132 provided by the load connection interfaces 318 via routing. In exemplary embodiments, the positive DC bus connection interfaces 310 and the negative DC bus connection interfaces 312 are also electrically connected to opposing terminals of a snubber capacitor 118 on the power converter substrate 116, 204, 300.

As illustrated, the positive DC bus connection interfaces 310 and the negative DC bus connection interfaces 312 are interleaved with one another by alternately interposing connection interfaces 330 of the positive DC bus connection subset 310 between neighboring connection interfaces 332, 334 of the negative DC bus connection subset 312, with the neighboring negative DC bus connection interfaces 332, 334 themselves being interposed between the positive DC bus connection interfaces 330 and neighboring ones of the positive DC bus connection subset 310. By providing current flows in opposite directions that are interleaved and adjacent or otherwise proximate one another, the parasitic inductance associated with the DC link connection interface 112 is reduced by virtue of the opposing electromagnetic fields in close proximity. Reducing the parasitic inductance associated with the DC link connection interface 112 that resides between the terminals of the DC link capacitor 106, 206 and the power converter 108 allows for the use of smaller snubber capacitances, and also increases the natural frequency and decreases settling time, thereby reducing voltage ringing on the DC voltage bus 102 due to operation of the switching elements of the power converter 108.

It should be noted that although FIG. 3 depicts interleaving solely along a longitudinal dimension (or row) of the connection structure 306, where connection interfaces of the first subset 310 are separated or spaced apart from neighboring connection interfaces of the first subset 310 by an intervening adjacent connection interface of the second subset 312 along the longitudinal direction while remaining electrically connected and adjacent to another connection interface of the first subset 310 in the lateral direction, in alternative embodiments, the subsets 310, 312 of connection interfaces may be interleaved in both the longitudinal and lateral dimensions so that none of the connection interfaces of the first subset 310 are adjacent to another of the connection interfaces of the first subset 310 and none of the connection interfaces of the second subset 312 are adjacent to another of the connection interfaces of the second subset 312. That said, increasing the complexity of the interleaving may increase the cost or complexity of routing to/from the individual connection interfaces of the respective subsets 310, 312 such that any further reduction in parasitic impedance may be offset or outweighed by the added costs or complexity of manufacturing. In this regard, there are various potential ways for alternating or interleaving connection interfaces to achieve reduced parasitic inductance, and the subject matter described herein is not necessarily intended to be limited to any one of the embodiments depicted or described herein. Thus, while FIG. 3 depicts one example of alternating and interleaving the pinout of a relatively high pin count header in order to minimize return current loops and associated parasitic inductance, the number of interconnect pins and the manner in which the pinout it interleaved may vary to suit the needs of a particular application or implementation.

Figure 4:
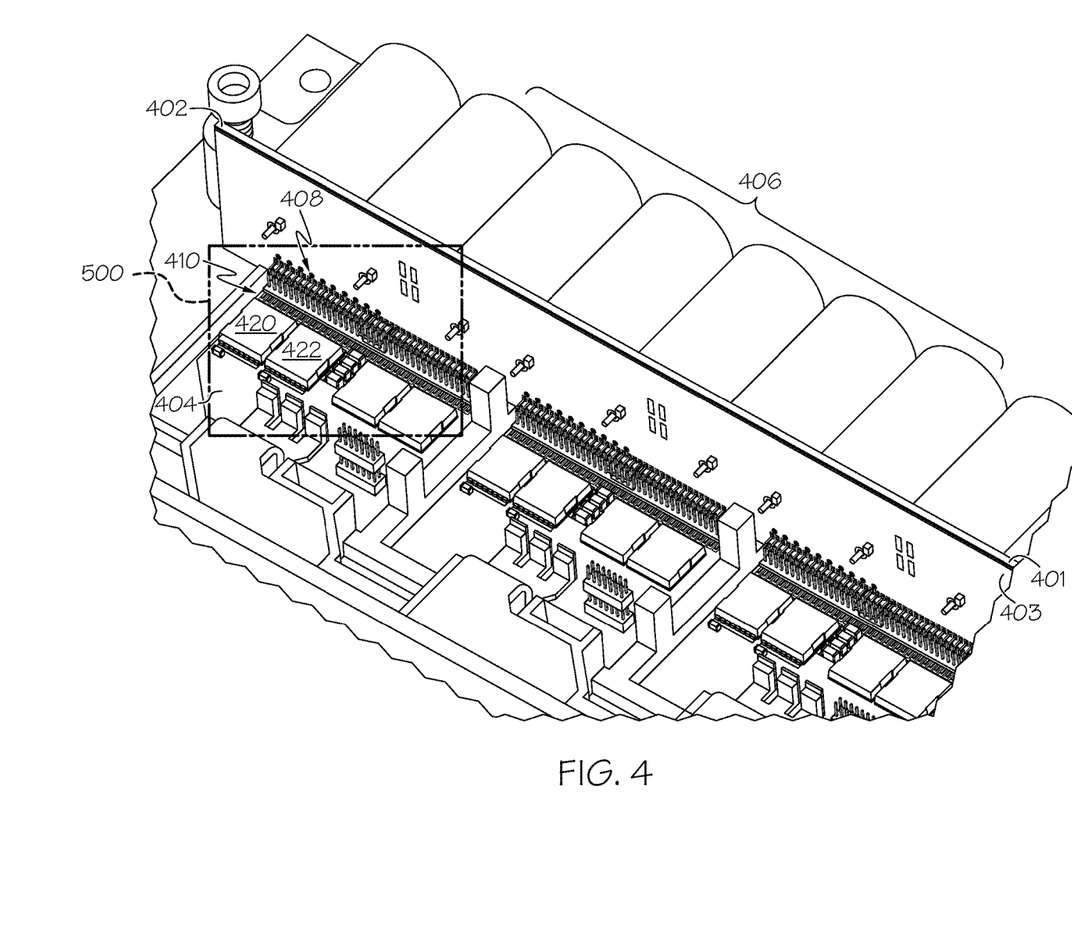
FIG. 4 depicts a partial perspective view of an electrical system including a DC link substrate and a power converter substrate suitable for use with the electrical system of FIG. 1 in accordance with one or more exemplary embodiments.
Figure 5:
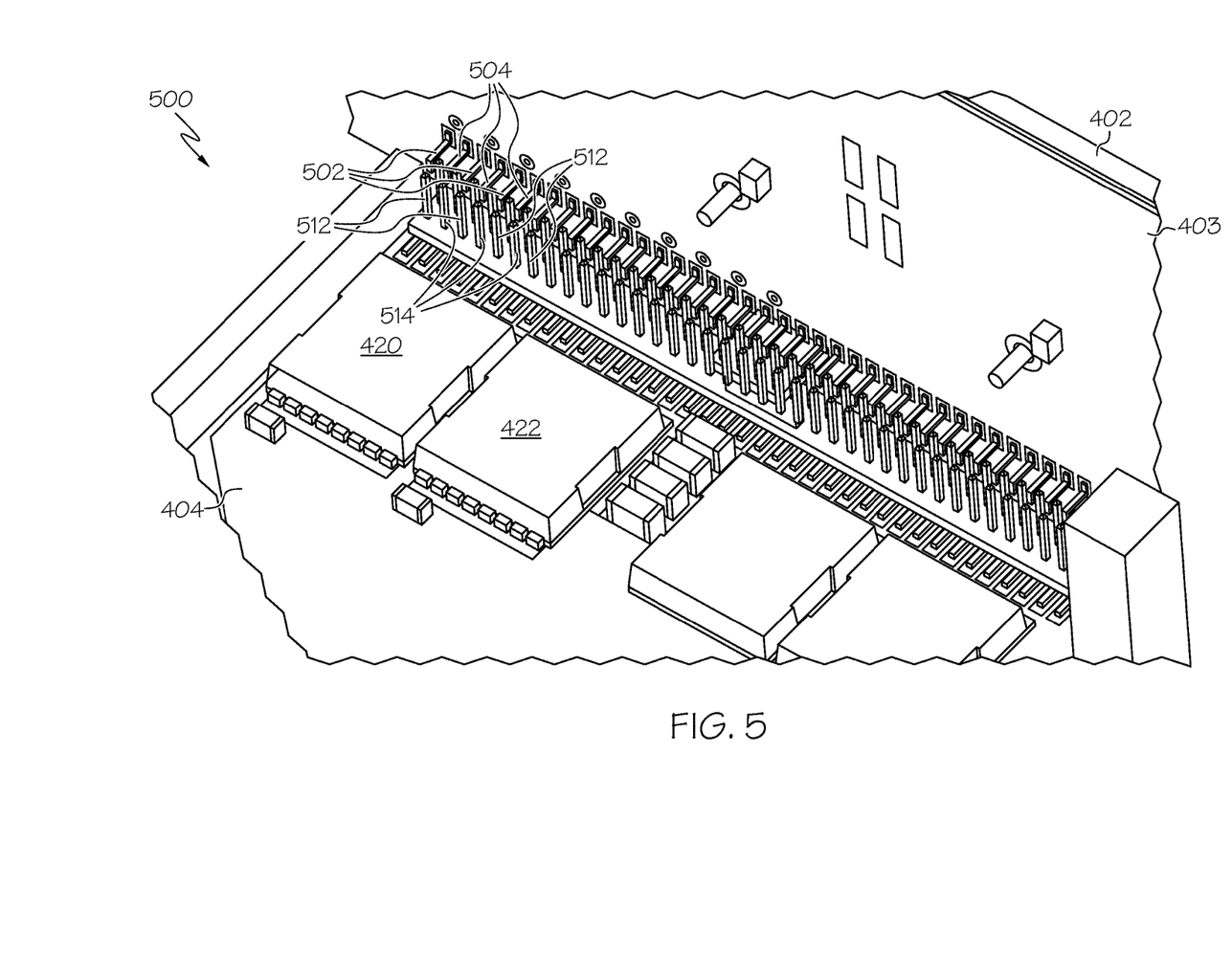
FIG. 5 depicts a detailed view of a portion of the electrical system of FIG. 4.

FIGS. 4-5 depict another exemplary arrangement of a DC link substrate 402 coupled to a power converter substrate 404 suitable for use as the DC link substrate 114 and the power converter substrate 116 in the electrical system 100 of FIG. 1, where FIG. 5 depicts a detailed portion 500 illustrating the DC link interconnection in the context of a pair of switching elements 420, 422 that may be configured as an inverter phase leg (e.g., switches 120, 122). A plurality of DC link capacitors 406 are mounted, soldered, or otherwise provided on a first side 401 of the DC link substrate 402, and a connection structure 408 including a plurality of connection interfaces is provided on a second side 403 of the DC link substrate 402. In one or more embodiments, the first side 401 of the DC link substrate 402 includes or is otherwise realized as a metal layer configured to provide a first bus bar of a DC voltage bus 102, with the opposing side 403 of the DC link substrate 402 including a bus bar of the DC voltage bus 102 having the opposite polarity as that on the first side 401. In this regard, the positive electrodes or terminals of the DC link capacitors 406 may be electrically connected to the positive bus bar provided on one side of the DC link substrate 402, with the negative electrodes or terminals of the DC link capacitors 406 being electrically connected to the negative bus bar provided on the opposing side of the DC link substrate 402.

The power converter substrate 404 includes a plurality of switching elements 420, 422 provided thereon in addition to a connection structure 410 including a plurality of connection interfaces configured to physically interface with those of the DC link connection structure 408. As described above, the different polarities of the DC link connection interfaces of the respective connection structures 408, 410 are interleaved with one another to reduce parasitic inductance associated with the interface between the DC voltage bus on the DC link substrate 402 and the electrical circuitry on the power converter substrate 404. In this regard, a positive DC bus bar subset 502 of the connection interfaces of the DC link connection structure 408 are electrically connected to the positive voltage rail bus bar on the DC link substrate 402 and interleaved with a negative DC bus bar subset 504 of the connection interfaces of the DC link connection structure 408, which are electrically connected to the negative voltage rail bus bar on the DC link substrate 402. For example, a pin of the negative DC bus bar subset 504 may be interposed between each pair of neighboring pins of the positive DC bus bar subset 502, and vice versa, so that pins having a common polarity are not adjacent to one another.

Similarly, a positive DC reference voltage input subset 512 of the connection interfaces of the power converter connection structure 410 are electrically connected to the drain terminal of a first switching device 420 and interleaved with a negative DC reference voltage input subset 514 of the connection interfaces of the power converter connection structure 410, which are electrically connected to the source terminal of another switching device 422 that is paired with the first switching device 420 to form a phase leg. The positive DC reference voltage input subset 512 of connection interfaces is configured to mate or otherwise engage with the positive DC bus bar subset 502 of connection interfaces and the negative DC reference voltage input subset 514 of the connection interfaces is configured to mate or otherwise engage with the negative DC bus bar subset 504 of connection interfaces when the substrates 402, 404 are joined or otherwise engaged with one another, thereby providing the desired interleaved electrical connections to/from the DC voltage bus and the switching devices 420, 422 of the power converter.

Figure 6:
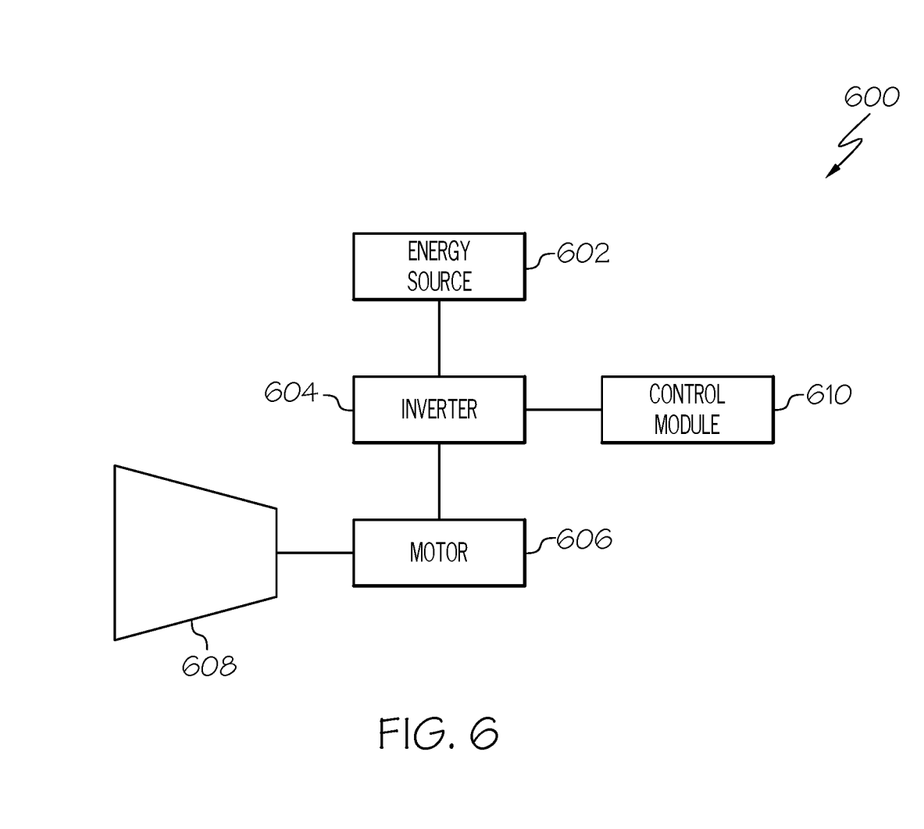
FIG. 6 is a block diagram of an exemplary embodiment of a vehicle electrical system suitable for use with the electrical system of FIG. 1 in accordance with one or more exemplary embodiments.

FIG. 6 depicts an exemplary embodiment of a vehicle electrical system 600 suitable for use with the electrical system 100 of FIG. 1. In the embodiment of FIG. 6, the electrical load 110 is realized as a motor 606 (or motor-generator) or similar actuator that is coupled to the rotary shaft of a flow control device 608, such as a compressor, a turbine, a turbocharger, or the like. In this regard, a control module 610 is coupled to a power inverter 604 (e.g., inverter 108) and provides commands for operating the switching elements of the inverter 604 to achieve the desired energy flow from a DC energy source 602 to the motor 606. For example, the control module 610 may provide PWM commands that cause the inverter 604 to operate the motor 606 to alter the fluid flow rate through the flow control device 608 at various times during operation of a vehicle, and thereby alter the airflow to/from an internal combustion engine or other component of the vehicle.

While the subject matter described herein is not necessary limited to any particular type of electrical system or power inverter, utilizing an interleaved interconnect between the power inverter 604 and the motor 606 associated with a turbocharger 608 operating on a 48 V automotive bus is advantageous in that the root-mean-square (RMS) current through the motor 606 could reach 400 Amperes or more. Accordingly, minimizing the value of the parasitic inductance L in the equation for the voltage across a series inductance $$\left(V = L\frac{di}{dt}\right)$$

mitigates the $$\frac{di}{dt}$$

term particularly as the motor currents and switching frequencies increase.

By using multiple interleaved interconnects to distribute current flow between substrates in parallel rather than using individual interconnects, the parasitic inductance of the substrate interconnect is reduced. Thus, increased thermal isolation from power electronics can be achieved by providing DC link capacitor(s), bus bars, and other components on a separate DC link substrate without increased voltage ringing on the DC bus that would otherwise be attributable to the interconnect parasitic inductance. Additionally, the snubber capacitors on the power electronics substrate may be reduced or eliminated by reducing the parasitic series impedance between the DC link capacitor(s) and the power electronics.

For the sake of brevity, conventional techniques related to power conversion, voltage buses, electrical circuitry, pulse-width modulation, and other functional aspects of the systems (and the individual operating components of the systems) may not be described in detail herein. Furthermore, the connecting lines shown in the various figures contained herein are intended to represent exemplary functional relationships and/or physical couplings between the various elements. It should be noted that many alternative or additional functional relationships or physical connections may be present in an embodiment of the subject matter.

The foregoing description may refer to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically. Thus, although the drawings may depict one exemplary arrangement of elements or direct electrical connections between components, additional intervening elements, devices, features, or components may be present in an embodiment of the depicted subject matter. In addition, certain terminology may also be used in the description for the purpose of reference only, and thus is not intended to be limiting. For example, the terms "first," "second," and other such numerical terms referring to structures do not imply a sequence or order unless clearly indicated by the context.

The foregoing detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any theory presented in the preceding background, brief summary, or the detailed description.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the subject matter in any way. Rather, the foregoing detailed description will provide those skilled in the art with a convenient road map for implementing an exemplary embodiment of the subject matter. It should be understood that various changes may be made in the function and arrangement of elements described in an exemplary embodiment without departing from the scope of the subject matter as set forth in the appended claims. Accordingly, details of the exemplary embodiments or other limitations described above should not be read into the claims absent a clear intention to the contrary.

What is claimed is:

1. An electrical system comprising:
   a first substrate comprising one or more capacitors on a first side and a first plurality of connection interfaces on a second side opposite the first side, wherein:
      a first subset of the first plurality of connection interfaces is electrically connected to a first reference voltage node;
      a second subset of the first plurality of connection interfaces is electrically connected to a second reference voltage node different from the first reference voltage node; and
      the first subset and the second subset are interleaved; and
   a second substrate comprising a second plurality of connection interfaces, wherein:
      a third subset of the second plurality of connection interfaces is electrically connected to a first terminal of a first switching element and coupled to the first subset of the first plurality of connection interfaces;
      a fourth subset of the second plurality of connection interfaces is electrically connected to a second terminal of a second switching element and coupled to the second subset of the first plurality of connection interfaces; and
      the third subset and the fourth subset are interleaved.

2. The electrical system of claim 1, wherein:
   the first subset and the third subset are in direct contact; and
   the second subset and the fourth subset are in direct contact.

3. The electrical system of claim 1, wherein individual connection interfaces of the second subset are interposed between individual connection interfaces of the first subset.

4. The electrical system of claim 1, wherein connection interfaces of the first subset are spaced apart from neighboring connection interfaces of the first subset by an adjacent connection interface of the second subset.

5. The electrical system of claim 1, wherein:
   none of the connection interfaces of the first subset are adjacent to another of the connection interfaces of the first subset; and
   none of the connection interfaces of the second subset are adjacent to another of the connection interfaces of the second subset.

6. The electrical system of claim 1, wherein:
   the first switching element comprises a first field effect transistor mounted on the second substrate; and
   the second switching element comprises a second field effect transistor mounted on the second substrate.

7. The electrical system of claim 6, wherein:
   the first reference voltage node comprises a first bus bar on the first substrate; and
   the second reference voltage node comprises a second bus bar on the first substrate.

8. The electrical system of claim 7, wherein:
   the first bus bar comprises a positive reference voltage rail of a direct current (DC) voltage bus; and the second bus bar comprises a negative reference voltage rail of the DC voltage bus;
the first terminal comprises a drain terminal of the first field effect transistor; and
the second terminal comprises a source terminal of the second field effect transistor.

9. The electrical system of claim 6, wherein the first field effect transistor and the second field effect transistor comprise surface mount devices mounted on a side of the second substrate facing the second side.

10. The electrical system of claim 9, wherein the one or more capacitors comprise one or more electrolytic capacitors.

11. An electrical system comprising:
a first substrate comprising:
a pair of voltage rails configured to provide a voltage bus;
one or more capacitive elements coupled between the pair of voltage rails to provide a direct current (DC) link capacitance; and
a first plurality of connection interfaces electrically connected to a first voltage rail of the pair;
a second plurality of connection interfaces electrically connected to a second voltage rail of the pair, wherein the second plurality of connection interfaces are interleaved with the first plurality of connection interfaces; and
a second substrate comprising
a third plurality of connection interfaces electrically connected to the first plurality of connection interfaces;
a fourth plurality of connection interfaces electrically connected to the second plurality of connection interfaces, wherein the fourth plurality of connection interfaces are interleaved with the third plurality of connection interfaces; and
a power conversion arrangement coupled to the third plurality of connection interfaces and the fourth plurality of connection interfaces.

12. The electrical system of claim 11, wherein the one or more capacitive elements are provided on a first side of the first substrate and the first plurality of connection interfaces and the second plurality of connection interfaces are provided on a second side of the first substrate opposite the first side.

13. The electrical system of claim 12, wherein the third plurality of connection interfaces, the fourth plurality of connection interfaces, and the power conversion arrangement are provided on a third side of the second substrate facing the second side of the first substrate.

14. The electrical system of claim 13, wherein:
the one or more capacitive elements comprise one or more electrolytic capacitors; and
the power conversion arrangement comprises a plurality of surface mount devices.

15. The electrical system of claim 11, further comprising:
an electric motor coupled to the power conversion arrangement; and
a flow control device having a rotary shaft coupled to a rotor of the electric motor, wherein the power conversion arrangement comprises a plurality of switching elements operable to actuate the rotor of the electric motor.

16. The electrical system of claim 15, wherein:
the voltage bus comprises a 48 Volt bus; and
the flow control device comprises at least one of a compressor and a turbine.

17. The electrical system of claim 16, further comprising a control module coupled to the power conversion arrangement to operate the plurality of switching elements using pulse width modulation.

18. An electrical system comprising:
a first substrate comprising one or more capacitors on a first side of the first substrate and a first plurality of connection interfaces on a second side of the first substrate opposite the first side, wherein:
a first electrode of the one or more capacitors is coupled to a first bus bar on the first side of the first substrate;
a second electrode of the one or more capacitors is coupled to a second bus bar on the second side of the first substrate;
a first subset of the first plurality of connection interfaces is electrically connected to the first bus bar;
a second subset of the first plurality of connection interfaces is electrically connected to the second bus bar; and
connection interfaces of the first subset are alternately interposed with connection interfaces of the second subset; and
a second substrate comprising a second plurality of connection interfaces, wherein:
a third subset of the second plurality of connection interfaces is coupled to the first subset of the second plurality of connection interfaces;
a fourth subset of the second plurality of connection interfaces is coupled to the second subset of the second plurality of connection interfaces;
a first switching element is coupled between the third subset of the second plurality of connection interfaces and an output node;
a second switching element is coupled between the output node and the fourth subset; and
connection interfaces of the third subset are alternately interposed with connection interfaces of the fourth subset.

19. The electrical system of claim 18, wherein the one or more capacitors comprise a direct current (DC) link capacitor.

20. The electrical system of claim 18, wherein the first switching element and the second switching element are surface mounted to a third side of the second substrate facing the second side of the first substrate.

* * * * *